US012635188B2

(12) United States Patent
Hayashi

(10) Patent No.: US 12,635,188 B2
(45) Date of Patent: May 19, 2026

(54) SEMICONDUCTOR DEVICE INCLUDING MEMORY STRUCTURE ARRANGED ADJACENT TO PLANAR GATE STRUCTURE

(71) Applicant: ROHM CO., LTD., Kyoto (JP)

(72) Inventor: Yasunobu Hayashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 719 days.

(21) Appl. No.: 17/899,057

(22) Filed: Aug. 30, 2022

(65) Prior Publication Data

US 2023/0085550 A1 Mar. 16, 2023

(30) Foreign Application Priority Data

Sep. 15, 2021 (JP) ................................. 2021-149911

(51) Int. Cl.
*H10D 30/69* (2025.01)
*H10D 30/60* (2025.01)

(52) U.S. Cl.
CPC ........... *H10D 30/69* (2025.01); *H10D 30/603* (2025.01)

(58) Field of Classification Search
CPC ........ H10B 20/20; H10B 43/30; H10B 10/10; H10B 12/10; H10B 20/10; H10D 30/0413;

(Continued)

(56) References Cited

U.S. PATENT DOCUMENTS 7,053,437 B2 * 5/2006 Iwata ..................... H10B 69/00
257/314
7,482,231 B2 * 1/2009 Lee .................... H10D 84/0184
438/303

(Continued)

FOREIGN PATENT DOCUMENTS

JP 2004348809 A 12/2004
JP 2005-064295 A 3/2005

(Continued)

OTHER PUBLICATIONS

Japanese Office Action dated Apr. 22, 2025, in the counterpart Japanese Patent Application No. 2021-149911.

(Continued)

*Primary Examiner* — Khaja Ahmad
*Assistant Examiner* — Candice Chan
(74) *Attorney, Agent, or Firm* — Rabin & Berdo, P.C.

(57) ABSTRACT
A semiconductor device includes: a semiconductor layer having a main surface; a first-conduction-type well region formed on a surface portion of the main surface of the semiconductor layer; a second-conduction-type first region formed on a surface portion of the well region; a second-conduction-type second region formed on the surface portion of the well region at an interval from the first region; a first-conduction-type diffusion layer formed on the surface portion of the main surface adjacent to the first region; a planar gate structure formed on the main surface of the semiconductor layer to face a first-conduction-type channel region between the first region and the second region; and a memory structure including a charge storage film arranged adjacent to a lateral side of the planar gate structure on a side of the first region.

15 Claims, 8 Drawing Sheets

(58) Field of Classification Search
CPC .......... H10D 84/0128; H10D 84/0167; H10D
84/017; H10D 30/0218; H10D 30/022;
H10D 30/601–608; H10D 30/6715–6721
See application file for complete search history.

(56)                    References Cited

U.S. PATENT DOCUMENTS

| | | | | |
|---|---|---|---|---|
| 2007/0111357 A1* | 5/2007 | Wang | ..................... | H10B 69/00 |
| | | | | 257/E21.679 |
| 2011/0233649 A1* | 9/2011 | Shimizu | ............... | H10D 64/037 |
| | | | | 257/E21.423 |
| 2013/0307070 A1* | 11/2013 | Huang | ............... | H10D 30/0221 |
| | | | | 257/E29.256 |

FOREIGN PATENT DOCUMENTS

| | | | |
|---|---|---|---|
| JP | 2006024680 A | 1/2006 |
| JP | 2007142398 A | 6/2007 |
| JP | 2007173502 A | 7/2007 |
| JP | 2016035973 A | 3/2016 |
| JP | 2018056311 A | 4/2018 |

OTHER PUBLICATIONS

Japanese Office Action issued in the corresponding Japanese patent
application on Sep. 2, 2025.

\* cited by examiner

Erasing

FIG. 6A

SEMICONDUCTOR DEVICE INCLUDING MEMORY STRUCTURE ARRANGED ADJACENT TO PLANAR GATE STRUCTURE

CROSS-REFERENCE TO RELATED APPLICATION(S)

This application is based upon and claims the benefit of priority from Japanese Patent Application No. 2021-149911, filed on Sep. 15, 2021, the entire contents of which are incorporated herein by reference.

TECHNICAL FIELD

The present disclosure relates to a semiconductor device.

BACKGROUND

For example, there is known a semiconductor device including a non-volatile memory. In a memory cell provided in the semiconductor device, a gate electrode is formed on a p-well region via a gate insulating film. On the lateral side of the gate electrode, a silicon oxide film, a silicon nitride film, and a silicon oxide film are sequentially stacked on a resistance change portion formed on the surface portion of the p-well region. In this memory cell, writing is performed by implanting hot electrons generated in the vicinity of a drain region into the silicon nitride film. Since this memory cell is used as an OTPROM (One Time Programmable Read Only Memory), no erasing operation is performed except for a product quality confirmation test.

SUMMARY

Some embodiments of the present disclosure provide a semiconductor device capable of repeatedly writing and erasing data in a memory structure arranged adjacent to a lateral side of a planar gate structure.

According to one embodiment of the present disclosure, a semiconductor device includes: a semiconductor layer having a main surface; a first-conduction-type well region formed on a surface portion of the main surface of the semiconductor layer; a second-conduction-type first region formed on a surface portion of the well region; a second-conduction-type second region formed on the surface portion of the well region at an interval from the first region; a first-conduction-type diffusion layer formed on the surface portion of the main surface adjacent to the first region; a planar gate structure formed on the main surface of the semiconductor layer so as to face a first-conduction-type channel region between the first region and the second region; and a memory structure including a charge storage film arranged adjacent to a lateral side of the planar gate structure on a side of the first region.

BRIEF DESCRIPTION OF DRAWINGS

The accompanying drawings, which are incorporated in and constitute a part of the specification, illustrate embodiments of the present disclosure.

FIGS. 6A and 6B are diagrams for explaining a read operation for the memory structure of the semiconductor device according to an embodiment of the present disclosure.

DETAILED DESCRIPTION

Figure 1:
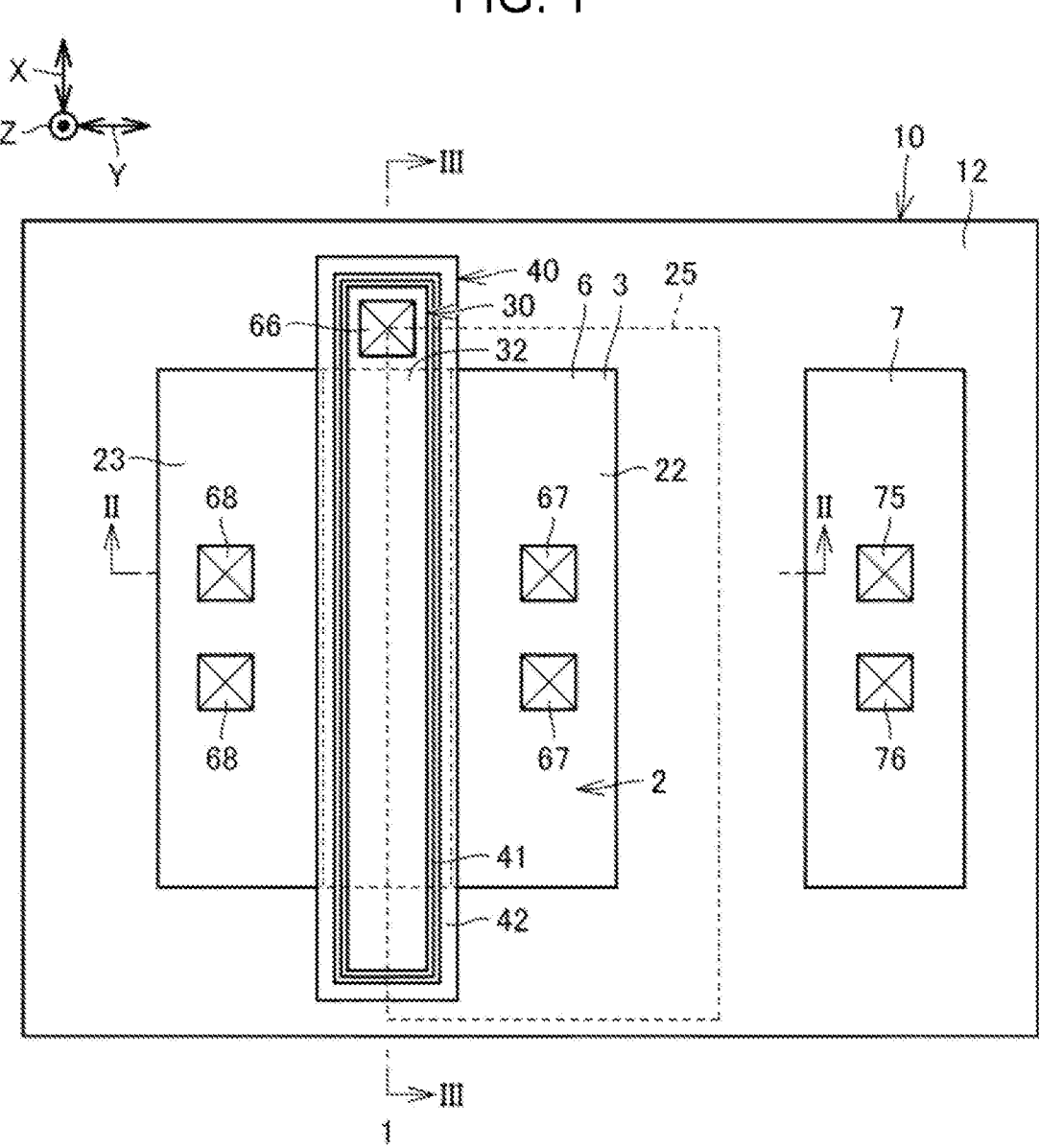
FIG. 1 is a plan view of a semiconductor device according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment of the present disclosure will be described in detail with reference to the drawings. The same or corresponding parts in the drawings are designated by the same reference numerals, and the description thereof will be omitted.

Embodiment

[Structure of Semiconductor Device]

Figure 2:
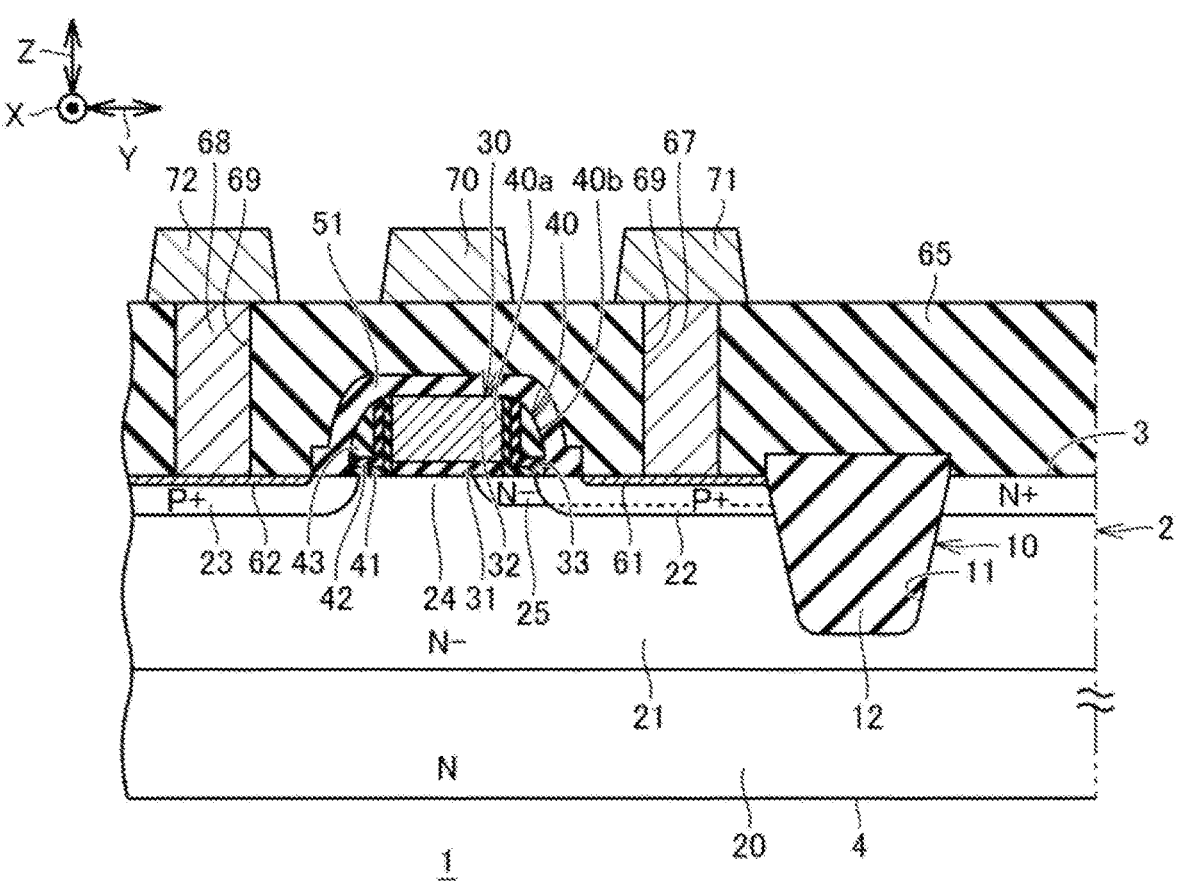
FIG. 2 is a cross-sectional view taken along line II-II in FIG. 1.
Figure 3:
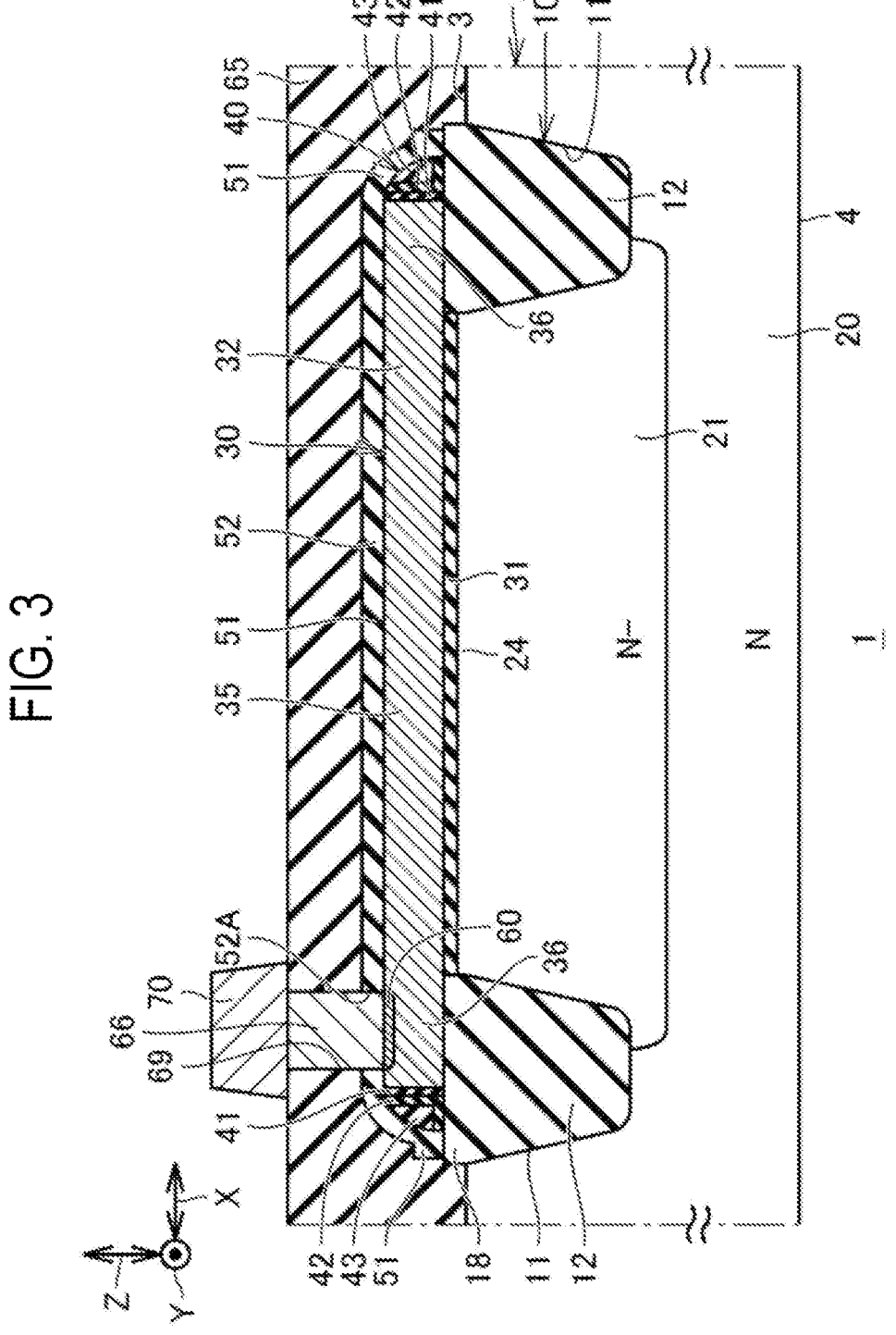
FIG. 3 is a cross-sectional view taken along line III-III in FIG. 1.

FIG. 1 is a plan view of a semiconductor device according to an embodiment of the present disclosure. FIG. 2 is a cross-sectional view taken along line II-II in FIG. 1. FIG. 3 is a cross-sectional view taken along line III-III in FIG. 1. In FIG. 1, an insulating spacer 43, a covering insulating film 51, and an interlayer insulating film 65, which will be described later, are omitted in order to explain the configuration in an easy-to-understand manner.

The semiconductor device 1 is a non-volatile memory using a MOSFET (Metal Oxide Semiconductor Field Effect Transistor). The semiconductor device 1 includes a semiconductor layer 2 made of a Si monocrystal.

In this embodiment, as shown in FIG. 2, the semiconductor layer 2 is formed in a rectangular cuboid shape. The semiconductor layer 2 has a first main surface 3 on one side and a second main surface 4 on the other side. The semiconductor device 1 includes an n-type (first-conduction-type) back gate region 20 formed on the semiconductor layer 2. The back gate region 20 is formed over the entire semiconductor layer 2.

The semiconductor device 1 is provided with a trench insulating structure to partition a device region in which a MOSFET is formed. Specifically, in the semiconductor device 1 shown in FIG. 2, a trench 11 and an insulating buried object 12 are provided as the trench insulating structure. The trench 11 is formed by digging the first main surface 3 toward the second main surface 4. As shown in FIG. 1, the trench 11 is formed in a rectangular ring shape in a plan view as seen from the normal direction Z of the first main surface 3 and the second main surface 4 (hereinafter simply referred to as a "plan view") to partition a device region having a rectangular shape. The direction in which one side of the device region 6 extends in a plan view is defined as first direction X. The direction orthogonal to both the first direction X and the normal direction Z is defined as second direction Y. The first direction X, the second direction Y, and the normal direction Z are indicated in FIGS. 1 to 3, respectively.

In the present embodiment, the trench 11 is formed in a tapered shape in which the opening width thereof narrows toward the bottom wall of the trench 11. The taper angle of the trench 11 may be more than 90° and 125° or less. The taper angle is preferably more than 90° and 100° or less. The taper angle of the trench 11 is an angle formed by the inner sidewall of the trench 11 with respect to the first main surface 3 in the semiconductor layer 2. Of course, the trench 11 may be formed perpendicularly to the first main surface 3.

The depth of the trench 11 may be 0.1 μm or more and 1 μm or less. The width of the trench 11 is arbitrary. The width of the trench 11 may be 0.1 μm or more and 10 μm or less. The width of the trench 11 is defined by the width in the direction orthogonal to the direction in which the trench 11 extends in a plan view.

The insulating buried object 12 is buried in the trench 11. The insulator constituting the insulating buried object 12 is arbitrary. The insulating buried object 12 may contain at least one of a silicon oxide ($SiO_2$) and a silicon nitride (SiN). In this embodiment, for example, the insulating buried object 12 is formed of a silicon oxide. The insulating buried object 12 may include a portion (protrusion portion) protruding from the semiconductor layer 2.

The semiconductor device 1 includes an n-type (first-conduction-type) well region 21 formed on the surface portion of the first main surface 3 in the device region. The well region 21 extends in the first direction X along the first main surface 3 in FIG. 2. The n-type impurity concentration in the well region 21 exceeds the n-type impurity concentration in the back gate region 20. The n-type impurity concentration in the well region 21 is, for example, $10 \times 10^{12}$ cm$^{-3}$ or more and $10 \times 10^{16}$ cm$^{-3}$ or less.

The bottom portion of the well region 21 is electrically connected to the back gate region 20. In this embodiment, the well region 21 is formed deeper than the trench 11 to partially cover the bottom wall of the trench 11. Of course, unlike this embodiment, the well region 21 may be formed so that the boundary between the well region 21 and the back gate region 20 is located at the same position as the bottom wall of the trench 11.

The semiconductor device 1 includes a p-type (second-conduction-type) source region 22 (first region) formed on the surface portion of the well region 21 and a p-type (second-conduction-type) drain region 23 (second region) formed on the surface portion of the well region 21 at an interval from the source region 22. The n-type impurity concentration in the source region 22 and the drain region 23 is, for example, $10 \times 10^{16}$ cm$^{-3}$ or more and $10 \times 10^{20}$ cm$^{-3}$ or less.

A MOSFET channel region 24 is formed between the drain region 23 and the source region 22. The channel region 24 forms a current path extending along the second direction Y between the source region 22 and the drain region 23. In this embodiment, the first region is described as a source region and the second region is described as a drain region. However, the first region may be a drain region and the second region may be a source region.

Further, on the side including the source region 22, as shown in FIG. 1, an n-type (first-conduction-type) LDD (Lightly Doped Drain) region (N-LDD region 25) having an impurity concentration lower than that of the source region 22 is provided in an overlapping manner. As shown in FIG. 2, the N-LDD region 25 is an n-type diffusion layer provided on one side adjacent to the source region 22, and is not provided on one side adjacent to the drain region 23. The adjacent region between the N-LDD region 25 and the source region 22 may be a region where the N-LDD region 25 and the source region 22 partially intersect, or a region where the N-LDD region 25 and the source region 22 do not intersect. Further, the semiconductor device 1 is provided with the N-LDD region 25 on one side adjacent to the source region 22, but is not provided with the N-LDD region 25 on one side adjacent to the drain region 23. Therefore, the concentration gradient of the first-conduction-type impurities in the region adjacent to the source region 22 is larger than the concentration gradient of the first-conduction-type impurities in the region adjacent to the drain region 23. By providing the N-LDD region 25, a step is formed at the bottom portion of the source region 22. That is, as shown in FIG. 2, the N-LDD region 25 is provided between the source region 22 and the channel region 24. On the other hand, the bottom portion of the drain region 23 where the N-LDD region 25 is not provided is flat without a step. The N-LDD region 25 is not provided between the drain region 23 and the channel region 24. Further, a p-type LDD region having a lower p-type impurity concentration than the source region 22 and the drain region 23 is not provided between the source region 22 and the channel region 24, and between the drain region 23 and the channel region 24. Of course, the semiconductor device 1 may be provided with an N-LDD region 25 on one side adjacent to the source region 22 after forming a p-type LDD region.

The semiconductor device 1 includes a planar gate structure 30 formed on the first main surface 3 so as to face the channel region 24. The planar gate structure 30 extends in the first direction X along the first main surface 3. The end portion of the planar gate structure 30 in the first direction X reaches the insulating buried object 12 on the trench insulating structure. Unlike this embodiment, the end portion of the planar gate structure 30 in the first direction X may extend to the outside of the trench insulating structure. The planar gate structure 30 is located between the source region 22 and the drain region 23 in a plan view.

The planar gate structure 30 includes a gate insulating film 31 formed on the semiconductor layer 2, and a gate electrode 32 formed on the gate insulating film 31. The gate insulating film 31 is made of an oxide of the semiconductor layer 2. Specifically, the gate insulating film 31 is made of an oxide formed into a film by oxidizing the surface portion of the first main surface 3. That is, the gate insulating film 31 is formed of a silicon oxide film ($SiO_2$ film) formed along the first main surface 3. More specifically, the gate insulating film 31 is made of a thermal oxide of the semiconductor layer 2 formed in a film shape by thermally oxidizing the surface portion of the first main surface 3 of the semiconductor layer 2. That is, the gate insulating film 31 is made of a silicon thermal oxide film (thermal oxide film) formed along the first main surface 3. The gate insulating film 31 may have a thickness of 7 nm or more and 13 nm or less.

The gate insulating film 31 extends in the first direction X along the first main surface 3. The gate insulating film 31 has a first surface in contact with the first main surface 3 and a second surface on the opposite side of the first main surface 3 from the semiconductor layer 2. The first surface and the second surface extend in parallel with each other, and the gate insulating film 31 may have a substantially constant thickness. Both ends of the gate insulating film 31 in the first direction X are connected to the insulating buried object 12.

The gate electrode 32 is made of conductive polysilicon. The gate electrode 32 is formed on the gate insulating film 31. The width (gate length) of the gate electrode 32 in the second direction Y may be 0.13 μm or more and 0.3 μm or less.

Referring to FIG. 3, the gate electrode 32 extends across the open end of the trench 11 and reaches the upper surface of the insulating buried object 12. Specifically, the gate electrode 32 includes a main body portion 35 facing the first main surface 3 with the gate insulating film 31 interposed therebetween, and an extraction portion 36 facing the insulating buried object 12.

The main body portion 35 is formed on the gate insulating film 31 along the gate insulating film 31. The extraction portion 36 is extracted from the main body portion 35 onto the protrusion 18 of the insulating buried object 12.

In the semiconductor device 1, a sidewall structure 40 including a nitride film of silicon nitride (SiN) is formed on the lateral side of the planar gate structure 30. The sidewall structure 40 is arranged adjacent to the lateral side of the planar gate structure 30 to cover the sidewall of the gate electrode 32. Specifically, the sidewall structure 40 covers the sidewall of the main body portion 35 of the gate electrode 32, and further covers the sidewall of the extraction portion 36. In this embodiment, data can be written, erased, and read by using the sidewall structure 40 (particularly, the side on which the N-LDD region 25 is provided) as described later. Therefore, the sidewall structure 40 functions as a memory structure including a charge storage film in the semiconductor device 1 which is a non-volatile memory.

The sidewall structure 40 has a rectangular ring shape surrounding the planar gate structure 30 in a plan view. Specifically, the sidewall structure 40 is formed in a portion located between the source region 22 and the planar gate structure 30, a portion located between the drain region 23 and the planar gate structure 30, and a portion located on the insulating buried object 12.

Referring to FIG. 2, the sidewall structure 40 has an inner surface 40a extending along the sidewall of the planar gate structure 30 and an outer surface 40b curved so as to protrude toward the side opposite to the planar gate structure 30 side. The sidewall structure 40 includes an insulating film 41 formed on the channel region 24, a nitride film 42 facing the channel region 24 with the insulating film 41 interposed therebetween, and an insulating spacer 43 formed on the nitride film 42. The nitride film 42 is formed on the channel region 24 and on the insulating film 41 formed on the lateral side of the planar gate structure 30. The nitride film 42 functions as a charge storage film in the memory structure.

The insulating film 41 is made of an oxide of the semiconductor layer 2 and the gate electrode 32. Specifically, the insulating film 41 is made of an oxide formed into a film by oxidizing the surface portion of the semiconductor layer 2 and the sidewall of the gate electrode 32. The insulating film 41 is composed of a silicon oxide film (SiO$_2$ film) formed along the first main surface 3 and the side surface of the gate electrode 32. More specifically, the insulating film 41 is made of a thermal oxide formed into a film by thermally oxidizing the surface portion of the semiconductor layer 2 and the sidewall of the gate electrode 32. That is, the insulating film 41 is composed of a silicon thermal oxide film formed along the first main surface 3 and the side surface of the gate electrode 32.

Since the insulating film 41 is composed of the oxides of the semiconductor layer 2 and the gate electrode 32, it is not formed on the insulating buried object 12 (see FIG. 3).

The insulating film 41 may have a thickness of 5 nm or more and 10 nm or less. The insulating film 41 is preferably thinner than the gate insulating film 31.

The insulating film 41 includes a portion extending along the first main surface 3 of the semiconductor layer 2 and a portion extending along the sidewall of the planar gate structure 30. The insulating film 41 may be formed in an L-shape in cross section by connecting these portions at right angles.

The insulating film 41 is formed on the first main surface 3 and is adjacent to the gate insulating film 31. The surface of the insulating film 41 on the first main surface 3 side is formed to be flush with the surface of the gate insulating film 31 on the first main surface 3 side. The surface of the insulating film 41 on the first main surface 3 side may be located closer to the second main surface 4 (see FIG. 2) than the surface of the gate insulating film 31 on the first main surface 3 side.

The nitride film 42, which is a charge storage film, is made of an insulator different from that of the insulating film 41, and may be formed of, for example, a silicon nitride film (SiN film). The nitride film 42 is formed along the insulating film 41. The nitride film 42 may have a thickness of 10 nm or more and 50 nm or less. The charge storage film will be described below as being the nitride film 42. However, the charge storage film is not limited to the nitride film as long as it can store electric charges.

The nitride film 42 has a rectangular ring shape surrounding the planar gate structure 30 in a plan view (see FIG. 1). That is, the nitride film 42 extends in the first direction X, and both ends of the nitride film 42 in the first direction X are located on the insulating buried object 12 (see FIG. 3).

The nitride film 42 includes a portion extending along the plane direction of the first main surface 3 and a portion extending along the sidewall direction of the planar gate structure 30. The nitride film 42 may be formed in an L-shape in cross section by connecting these portions at right angles.

The source region 22 and the drain region 23 are formed in a self-aligned manner with respect to the sidewall structure 40. Therefore, the boundary between the source region 22 and the channel region 24 substantially coincides with the boundary between the outer surface 40b of the sidewall structure 40 and the first main surface 3 in a plan view. Similarly, the boundary between the drain region 23 and the channel region 24 also substantially coincides with the boundary between the outer surface 40b of the sidewall structure 40 and the first main surface 3 in a plan view.

Strictly speaking, the boundary between the source region 22 and the channel region 24 is located slightly closer to the planar gate structure 30 than the boundary between the outer surface 40b of the sidewall structure 40 and the first main surface 3. The N-LDD region 25 is further located on the planar gate structure 30 side from the source region 22. Similarly, the boundary between the drain region 23 and the channel region 24 is also located slightly closer to the planar gate structure 30 than the boundary between the outer surface 40b of the sidewall structure 40 and the first main surface 3.

The nitride film 42 includes a recess formed by a portion extending along the plane direction of the first main surface 3 and a portion extending along the sidewall direction of the planar gate structure 30. The insulating spacer 43 is arranged adjacent to the nitride film 42 in the recess. The insulating spacer 43 is made of, for example, a silicon oxide. The insulating spacer 43 faces the insulating film 41 with the nitride film 42 interposed therebetween.

The semiconductor device 1 further includes the covering insulating film 51 that covers the planar gate structure 30 and the sidewall structure 40. Both ends of the covering insulating film 51 in the second direction Y are located on the side opposite to the planar gate structure 30 from the lateral side of the sidewall structure 40. The covering insulating film 51 extends in the first direction X, and both ends of the covering insulating film 51 in the first direction X reach the upper side of the insulating buried object 12 (see FIG. 3). Therefore, the covering insulating film 51 covers the source region 22 and the drain region 23, and further covers the insulating buried object 12.

Specifically, the covering insulating film 51 integrally includes a portion that covers the gate electrode 32, a portion that covers the outer surface 40b of the sidewall structure 40, a portion that covers the source region 22 and the drain region 23, and a portion that covers the protrusion of the insulating buried object 12.

The covering insulating film 51 includes a through-hole 52A formed in a region facing the trench insulating structure 10 with the gate electrode 32 interposed therebetween (see FIG. 3).

Referring to FIGS. 2 and 3, the semiconductor device 1 includes a gate silicide film 60, a source silicide film 61, and a drain silicide film 62. Referring to FIG. 3, the gate silicide film 60 is formed on the surface of the gate electrode 32 at a portion constituting the bottom portion of the through-hole 52A. The gate silicide film 60 is made of a polycide film integrally formed with the gate electrode 32.

Referring to FIG. 2, the source silicide film 61 and the drain silicide film 62 are composed of a silicide film integrally formed with the semiconductor layer 2. The source silicide film 61 is formed on the surface portion of the source region 22 on the side opposite to the sidewall structure 40 side with respect to the covering insulating film 51. The drain silicide film 62 is formed on the surface portion of the drain region 23 on the side opposite to the sidewall structure 40 side with respect to the covering insulating film 51.

Each of the gate silicide film 60, the source silicide film 61 and the drain silicide film 62 may contain at least one of TiSi, $TiSi_2$, NiSi, CoSi, $CoSi_2$, $MoSi_2$, and $WSi_2$.

The semiconductor device 1 includes an interlayer insulating film 65 that covers the first main surface 3. The interlayer insulating film 65 includes at least one of an oxide film ($SiO_2$ film) and a nitride film (SiN film). The interlayer insulating film 65 may have a monolayer structure made of an oxide film or a nitride film. The interlayer insulating film 65 may have a stacked structure in which one or more oxide films and one or more nitride films are stacked in an arbitrary order. The interlayer insulating film 65 covers the trench insulating structure 10, the source region 22, the drain region 23, the planar gate structure 30, and the sidewall structure 40 on the first main surface 3.

The semiconductor device 1 includes a gate contact electrode 66, a source contact electrode 67 and a drain contact electrode 68 that penetrate the interlayer insulating film 65.

The gate contact electrode 66 is electrically connected to the gate electrode 32 via the gate silicide film 60. Specifically, the gate contact electrode 66 is electrically connected to the gate electrode 32 so as to face the insulating buried object 12 with the gate electrode 32 interposed therebetween.

Unlike this embodiment, when the gate electrode 32 extends to the outside of the insulating buried object 12, the gate contact electrode 66 may face the semiconductor layer 2 outside the insulating buried object 12.

The source contact electrode 67 is electrically connected to the source region 22 via the source silicide film 61. The drain contact electrode 68 is electrically connected to the drain region 23 via the drain silicide film 62.

The gate contact electrode 66, the source contact electrode 67 and the drain contact electrode 68 are embedded in a contact hole 69 formed in the interlayer insulating film 65. Each of the contact electrodes (the gate contact electrode 66, the source contact electrode 67 and the drain contact electrode 68) is made of at least one of copper and tungsten.

A barrier electrode film may be provided between each contact electrode and the inner wall of the contact hole 69. The barrier electrode film may have a monolayer structure composed of a Ti film or a TiN film. The barrier electrode film may have a stacked structure including a Ti film and a TiN film stacked in an arbitrary order.

The semiconductor device 1 includes a gate wiring 70, a source wiring 71 and a drain wiring 72 formed on the interlayer insulating film 65. The gate wiring 70 is electrically connected to the gate contact electrode 66. The drain wiring 72 is electrically connected to the drain contact electrode 68. The source wiring 71 is electrically connected to the source contact electrode 67.

Each of the wirings (the gate wiring 70, the source wiring 71 and the drain wiring 72) may include at least one of an Al film, an AlSiCu alloy film, an AlSi alloy film and an AlCu alloy film.

A barrier wiring film may be provided between each wiring and the interlayer insulating film 65. The barrier wiring film may have a monolayer structure composed of a Ti film or a TiN film. The barrier wiring film may have a stacked structure including a Ti film and a TiN film stacked in an arbitrary order. The barrier wiring film may also be provided on each wiring.

A device region 6 shown in FIG. 1 is a $P^+$ active region. However, an $N^-$ active region 7 is provided on the right side thereof. Electrodes 75 and 76 are provided in the active region 7.

(Operation of Semiconductor Device)

Next, the respective operations (write operation, erase operation, and read operation) of the semiconductor device 1 will be specifically described with reference to the drawings. In any of the operations, a reference potential is applied to the back gate region 20 connected to the well region 21.

Figure 4A:
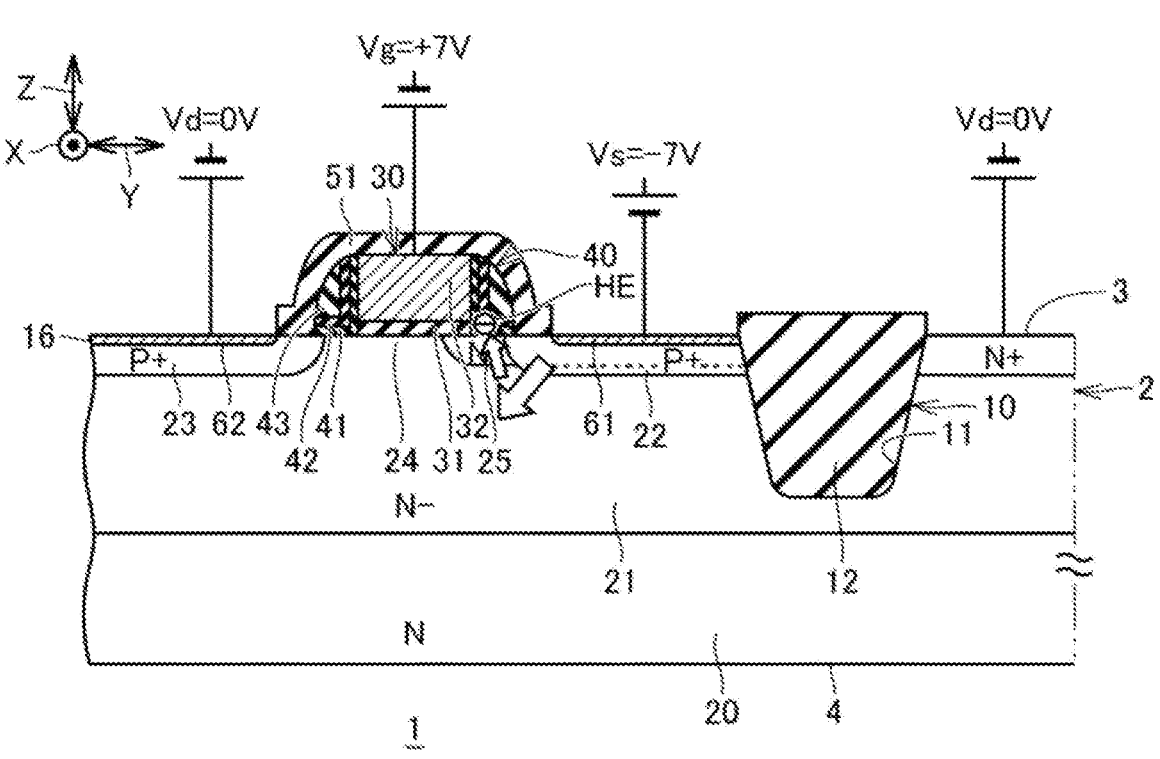
FIGS. 4A and 4B are diagrams for explaining a write operation for a memory structure of the semiconductor device according to an embodiment of the present disclosure.
Figure 4B:
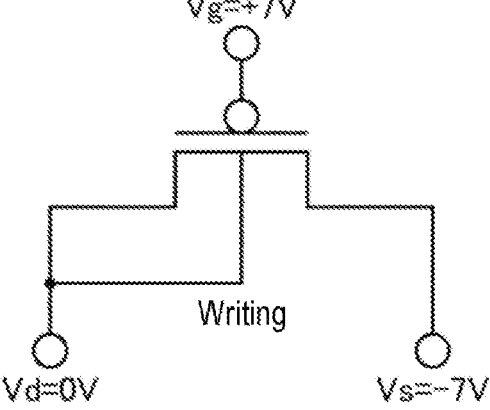

FIGS. 4A and 4B are diagrams for explaining the write operation for the memory structure of the semiconductor device according to the embodiment of the present disclosure. The gate potential Vg is a potential applied to the gate electrode 32. The source potential Vs is a potential applied to the source region 22. The drain potential Vd is a potential applied to the drain region 23.

As shown in the schematic diagram of FIG. 4A, the write operation of the semiconductor device 1 is achieved by injecting electrons (hot electrons HE) flowing in the source region 22 into the nitride film 42 which is a charge storage film. FIG. 4B is a circuit diagram of the semiconductor device 1 during the write operation.

Specifically, during the write operation, a positive potential (e.g., +7 V) is applied to the gate electrode 32, a negative potential (e.g., −7 V) is applied to the source region 22, (Vg=+7 V, and Vs=−7 V), and a reference potential is applied to the drain region 23 (Vd=0 V). As a result, the electrons generated by the band-to-band tunneling (BTBT) phenomenon at the end portion of the source region 22 due to the voltage applied between the source region 22 and the gate electrode 32 become hot electrons HE by being accelerated by the high voltage applied between the gate electrode 32 and the source region 22. In the semiconductor device 1, by providing the N-LDD region 25 on one side adjacent to the source region 22, the electric field at the end of the source region 22 is made large and the electrons are further accelerated, so that hot electrons HE are easy to generate. Then, a part of the hot electrons HE is attracted to the positive potential applied to the gate electrode 32 and is injected into the nitride film 42 which is a charge storage film. In the semiconductor device 1, since electrons are injected into the nitride film 42 by utilizing the BTBT phenomenon, it is possible to reduce the current required for the write operation.

The gate potential Vg in the write operation is not limited to +7 V, and the source potential Vs is not limited to −7 V. For example, the gate potential Vg may be an arbitrary potential selected from a range of 3 V or more and 7 V or less, and the source potential Vs may be an arbitrary potential selected from a range of −7 V or more and −3 V or less. The larger the potential amount (absolute value), the faster the write operation of the semiconductor device 1.

The potential difference between the source region 22 and the gate electrode 32 is called a gate-source voltage Vgs. For example, when the gate potential Vg is +7 V and the source potential Vs is −7 V, the gate-source voltage Vgs is 14 V (Vgs=14 V).

Due to the negative charge of the electrons injected by the write operation into the nitride film 42 as a charge storage film, a channel is formed in the channel region 24 and a current is allowed to flow between the source region 22 and the drain region 23. That is, the gate threshold voltage Vth decreases due to the negative charge of the electrons injected into the nitride film 42.

Figure 5A:
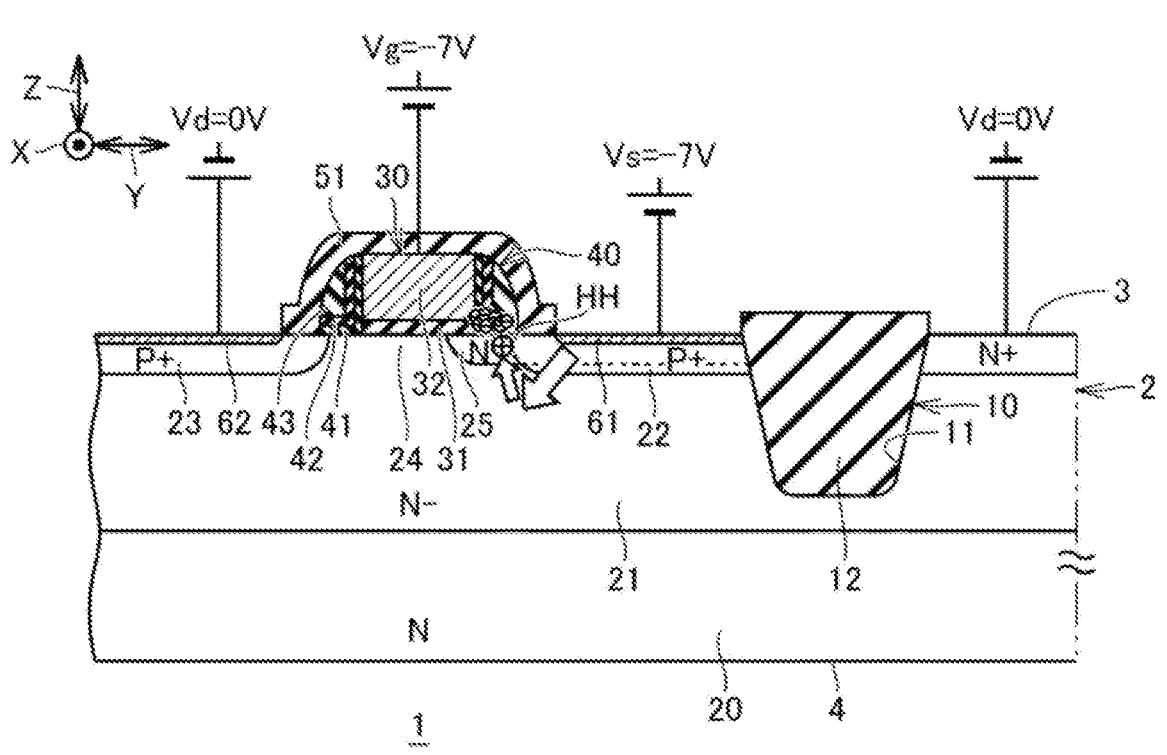
FIGS. 5A and 5B are diagrams for explaining an erase operation for the memory structure of the semiconductor device according to an embodiment of the present disclosure.
Figure 5B:
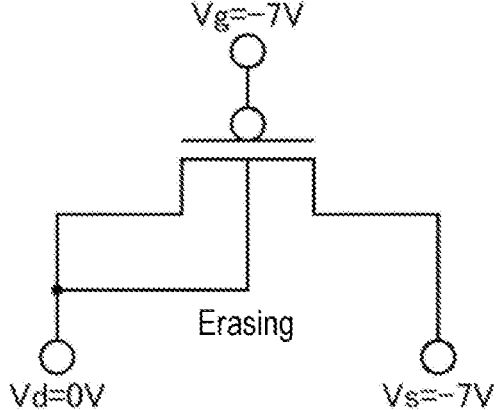

Next, the erase operation of the semiconductor device 1 will be described. FIGS. 5A and 5B are diagrams for explaining the erase operation for the memory structure of the semiconductor device according to the embodiment of the present disclosure. As shown in the schematic diagram of FIG. 5A, the erase operation is achieved by injecting holes (hot holes HH) generated by the band-to-band tunneling phenomenon into the nitride film 42. FIG. 5B is a circuit diagram of the semiconductor device 1 during the erase operation.

Specifically, during the erase operation, a negative potential (e.g., −7 V) is applied to the gate electrode 32, and a negative potential (e.g., −7 V) is applied to the source region 22 (Vg=−7 V, and Vs=−7 V). A reference potential is applied to the drain region 23 (Vd=0 V). As a result, the holes generated by the band-to-band tunneling phenomenon at the end portion of the source region 22 due to the voltage applied between the source region 22 and the gate electrode 32 become hot holes HH by being accelerated by the high voltage applied between the gate electrode 32 and the source region 22. Then, a part of the hot holes HH is attracted to the negative potential applied to the gate electrode 32, is injected into the nitride film 42 as a charge storage film, and is bonded to the electrons injected during the write operation.

The gate potential Vg in the erase operation is not limited to −7 V, and the source potential Vs is not limited to −7 V. For example, the gate potential Vg may be an arbitrary potential selected from the range of −7 V or more and −3 V or less, and the source potential Vs may be an arbitrary potential selected from the range of −7 V or more and −3 V or less. The larger the potential amount (absolute value), the faster the erase operation of the semiconductor device 1.

Due to the positive charge of the holes injected by the erase operation into the nitride film 42, which is a charge storage film, the channel formed in the channel region 24 disappears and no current flows between the source region 22 and the drain region 23. That is, the gate threshold voltage Vth rises due to the positive charge of the holes injected into the nitride film 42.

Figure 6A:
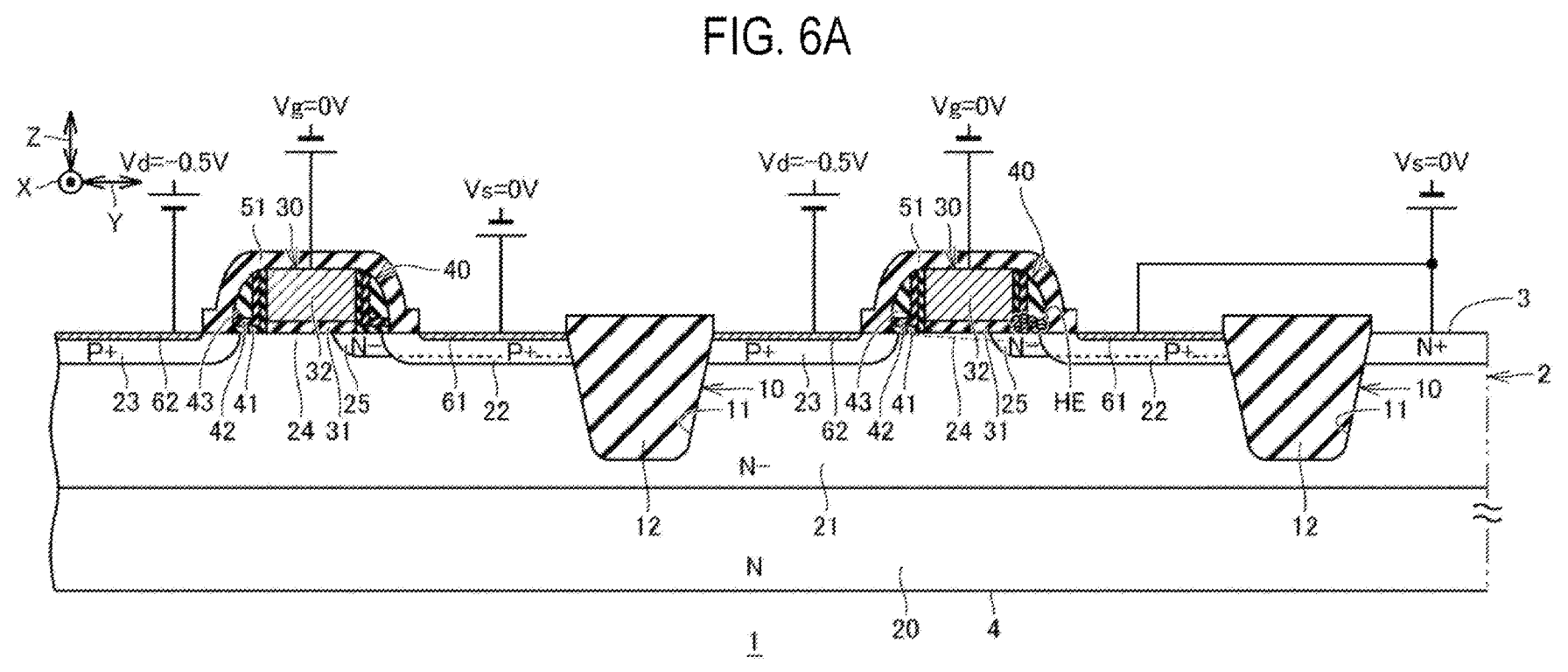
Figure 6B:
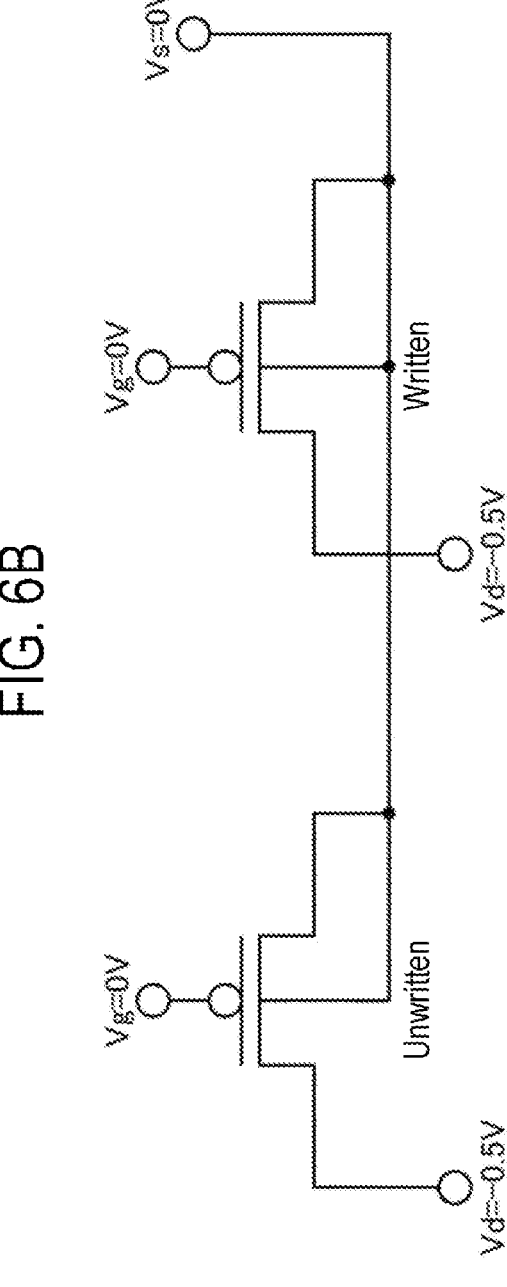

Next, the read operation of the semiconductor device 1 will be described. FIGS. 6A and 6B are diagrams for explaining the read operation for the memory structure of the semiconductor device according to the embodiment of the present disclosure.

As shown in the schematic diagram of FIG. 6A, a channel is formed in the channel region 24 due to the negative charge of the electrons injected into the nitride film 42, and a current is allowed to flow between the source region 22 and the drain region 23. Therefore, during the read operation, it is possible to determine whether or not data is written in the memory structure depending on the presence or absence of the drain-source current Ids in a state in which the potential is not applied to the gate electrode 32. FIG. 6B is a circuit diagram of the semiconductor device 1 during the read operation.

Specifically, in both the written state and the unwritten state, during the read operation, a reference potential is applied to the gate electrode 32 (Vg=0 V) without applying a positive potential to the gate electrode 32, a negative potential (e.g., −0.5 V) is applied to the drain region 23, and a reference potential is applied to the source region 22 (Vs=0 V).

In the written semiconductor device 1, as shown in FIG. 6A, a channel is formed in the channel region 24 due to the negative charge of the electrons injected into the nitride film 42, and a drain-source current Ids is generated. On the other hand, in the unwritten semiconductor device 1, since electrons are not injected into the nitride film 42 as shown in FIG. 6A, no channel is formed in the channel region 24 and no drain-source current Ids is generated.

Figure 7:
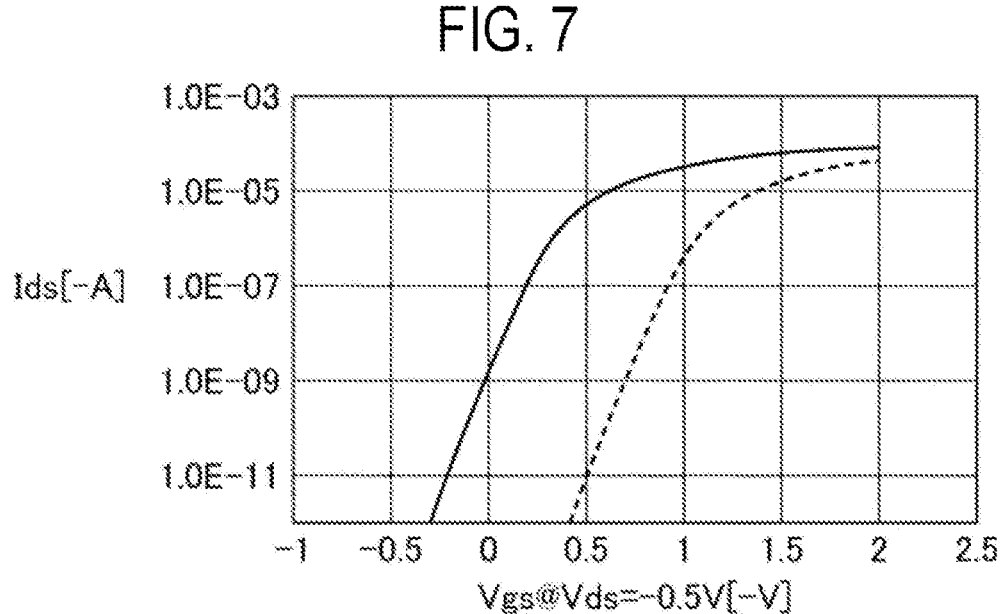
FIG. 7 is a graph showing a relationship between a gate potential and a drain-source current in a written state and an unwritten state.

FIG. 7 is a graph showing a relationship between the gate potential and the drain-source current in the written state and the unwritten state. In FIG. 7, the horizontal axis indicates the gate-source voltage Vgs, and the vertical axis indicates the drain-source current Ids. The gate-source voltage Vgs indicated in FIG. 7 is a voltage available when the drain-source voltage Vds is −0.5 V. Further, in FIG. 7, the writing time of the semiconductor device 1 is set to 100 ms.

As shown in FIG. 7, in the written semiconductor device 1, even if the gate-source voltage Vgs is 0 V, a current of approximately $1.0\,E^{-9}$ [−A] flows as the drain-source current Ids. However, in the unwritten semiconductor device 1, when the gate-source voltage Vgs is 0 V, no current flows as the drain-source current Ids.

That is, when the gate-source voltage Vgs is 0 V, the written semiconductor device 1 can detect the drain-source current Ids in the read operation, and the unwritten semiconductor device 1 cannot detect the drain-source current Ids in the read operation. Using this principle, it is possible to determine whether or not data is written in the memory structure. Therefore, in the semiconductor device 1, the gate threshold voltage Vth before and after writing the data becomes 0 V, which makes it possible to reduce the voltage required for the operation at the time of reading the data.

The gate-source voltage Vgs in the read operation is not limited to 0 V, and may be any gate-source voltage Vgs falling within a range in which the drain-source current Ids cannot be detected in the unwritten semiconductor device 1. For example, as shown in FIG. 7, the gate-source voltage Vgs may be approximately 0.3 [−V].

In this embodiment, the p-channel type semiconductor device 1 includes the semiconductor layer 2 having the first main surface 3, the n-type well region 21 formed on the surface portion of the first main surface 3 of the semiconductor layer 2, the p-type source region 22 formed on the surface portion of the well region 21, and the p-type drain region 23 formed on the surface portion of the well region 21 at an interval from the source region 22. The semiconductor device 1 further includes the N-LDD region 25 (n-type diffusion layer) formed on the surface portion of the first main surface 3 adjacent to the source region 22, the planar gate structure 30 formed on the first main surface 3 of the semiconductor layer 2 to face the n-type channel region between the source region 22 and the drain region 23, and the memory structure including the nitride film 42 as a charge storage film arranged adjacent to the lateral side of the planar gate structure 30 on the source region 22 side. The first region may be the drain region 23, and the second region may be the source region 22. As a result, the semiconductor device 1 is a p-channel type semiconductor device, and data can be repeatedly written and erased in the memory structure arranged adjacent to the lateral side of the planar gate structure 30.

It is preferable that the memory structure is configured to inject hot electrons HE into the nitride film 42 by utilizing the BTBT phenomenon during the write operation. As a result, the semiconductor device 1 injects electrons into the nitride film 42 by utilizing the BTBT phenomenon, which makes it possible to reduce the current required for the write operation.

It is preferable that the memory structure has a gate-source voltage of 0 V during the read operation. As a result, the semiconductor device 1 has a gate threshold voltage Vth of 0 V before and after writing the data, which makes it possible to reduce the voltage required for the data reading operation.

The nitride film 42 is preferably formed on the channel region 24 and on the insulating film 41 formed on the lateral side of the planar gate structure 30. It is preferable that the nitride film 42 is an insulator different from the insulating film. It is preferable that the nitride film 42 is made of SiN and the insulating film 41 is made of $SiO_2$. It is preferable that the planar gate structure 30 includes a gate insulating film 31 formed on the first main surface 3 of the semiconductor layer 2 and a gate electrode 32 formed on the gate insulating film 31. The nitride film 42 is preferably formed as a sidewall structure 40 that covers the gate insulating film 31 and the lateral side of the gate electrode 32. As a result, the semiconductor device 1 can utilize the process of a general p-channel type MOSFET. By trapping electric charges in the nitride film 42 of the sidewall without an additional process, the semiconductor device 1 can be caused to function as a memory structure, thereby realizing a non-volatile memory.

It is preferable that the semiconductor device 1 further includes a covering insulating film 51 that covers the planar gate structure 30 and the sidewall structure 40 (memory structure). As a result, the semiconductor device 1 can prevent the planar gate structure 30 and the sidewall structure 40 from becoming silicide.

It is preferable that the covering insulating film 51 partially covers the source region 22 and the drain region 23 and that the semiconductor device 1 further includes a source silicide film 61 and a drain silicide film 62 formed on surface portions of the source region 22 and the drain region 23 on the side opposite to the sidewall structure 40 side with respect to the covering insulating film 51. As a result, the semiconductor device 1 can keep the source silicide film 61 and the drain silicide film 62 away from the nitride film 42 as compared with the configuration in which the covering insulating film 51 does not cover the source region 22 and the drain region 23. This makes it possible to suppress the outflow of electrons from the nitride film 42.

It is preferable that the source region 22 and the N-LDD region 25 include a partially overlapping region. Further, the concentration gradient of the first-conduction-type impurity in the region adjacent to the source region 22 is larger than the concentration gradient of the first-conduction-type impurity in the region adjacent to the drain region 23.

MODIFICATION

It has been described that in the semiconductor device 1 according to this embodiment, electric charges are trapped in the nitride film 42 included in the sidewall structure 40 to function as a memory structure. However, the present disclosure is not limited thereto. A semiconductor device that does not form the sidewall structure 40 may be used as long as at least a charge storage film (nitride film) is provided on the lateral side of the planar gate structure in which the n-type diffusion layer (N-LDD region) is formed.

The embodiment disclosed herein should be considered to be exemplary and not limitative in all respects. The scope of the present disclosure is defined by the scope of claims rather than the above description of the embodiment, and is intended to include all modifications within the meaning and scope equivalent to the scope of claims.

According to the present disclosure in some embodiments, it is possible to provide a semiconductor device capable of repeatedly writing and erasing data in a memory structure arranged adjacent to the lateral side of a planar gate structure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a semiconductor layer having a main surface;
   a well region having a first conduction type and formed on a surface portion of the main surface of the semiconductor layer;
   a first region having a second conduction type and formed on a surface portion of the well region;
   a second region having the second conduction type and formed on the surface portion of the well region at an interval from the first region;
   a diffusion layer having the first conduction type and formed on the surface portion of the main surface adjacent to the first region;

a planar gate structure formed on the main surface of the semiconductor layer to face a channel region having the first conduction type and between the first region and the second region; and a memory structure including a charge storage film arranged adjacent to a lateral side of the planar gate structure on a side of the first region, wherein the planar gate structure includes:

a gate electrode; and a gate insulating film formed between the main surface of the semiconductor layer and a bottom surface of the gate electrode, and wherein the diffusion layer and the gate insulating film include a partially overlapping region in a plan view.

2. The semiconductor device of claim 1, wherein the first conduction type is an n-type, and the second conduction type is a p-type.

3. The semiconductor device of claim 1, wherein the memory structure is configured to inject hot electrons into the charge storage film by utilizing a band-to-band tunneling phenomenon during a write operation.

4. The semiconductor device of claim 1, wherein the memory structure has a gate-source voltage of 0 V during a read operation.

5. The semiconductor device of claim 1, wherein the first region is a source region, and the second region is a drain region.

6. The semiconductor device of claim 1, wherein the charge storage film is formed on the channel region and on an insulating film formed on the lateral side of the planar gate structure.

7. The semiconductor device of claim 6, wherein the charge storage film is an insulator different from the insulating film.

8. The semiconductor device of claim 7, wherein the charge storage film is made of SiN, and the insulating film is made of $SiO_2$.

9. The semiconductor device of claim 1, wherein the charge storage film is formed as a sidewall structure that covers the gate insulating film and a lateral side of the gate electrode.

10. The semiconductor device of claim 1, further comprising:

a covering insulating film configured to cover a part of the first region, a part of the second region, the planar gate structure, and the memory structure; and an interlayer insulating film configured to cover the covering insulating film.

11. The semiconductor device of claim 10, wherein the semiconductor device further comprises a silicide film formed on surface portions of the first region and the second region on a side opposite to the memory structure with respect to the covering insulating film.

12. The semiconductor device of claim 1, wherein the first region and the diffusion layer include a partially overlapping region.

13. The semiconductor device of claim 1, wherein a concentration gradient of an impurity having the first conduction type in a region adjacent to the first region is larger than a concentration gradient of an impurity having the first conduction type in a region adjacent to the second region.

14. The semiconductor device of claim 1, wherein the gate insulating film is only formed on the bottom surface of the gate electrode so as to be in contact with the main surface of the semiconductor layer.

15. The semiconductor device of claim 1, further comprising:

a covering insulating film configured to cover a part of the first region, a part of the second region, the planar gate structure, and the memory structure; and an interlayer insulating film configured to cover the covering insulating film, wherein the diffusion layer partially overlaps with the gate insulating film and partially overlaps with the memory structure, in a plan view, and wherein the first region partially overlaps with the memory structure and partially overlaps with the covering insulating film, in a plan view.

* * * * *